(12) United States Patent
Tuchman

(10) Patent No.: US 9,121,889 B2
(45) Date of Patent: Sep. 1, 2015

(54) METHOD AND APPARATUS FOR IMPLEMENTING EIT MAGNETOMETRY

(71) Applicant: ENTANGLEMENT TECHNOLOGIES, LLC, Bridgewater, NJ (US)

(72) Inventor: Ari K. Tuchman, Palo Alto, CA (US)

(73) Assignee: ENTANGLEMENT TECHNOLOGIES, LLC, Bridgewater, NJ (US)

(*) Notice: Subject to any disclaimer, the term of this patent is extended or adjusted under 35 U.S.C. 154(b) by 59 days.

(21) Appl. No.: 14/141,637

(22) Filed: Dec. 27, 2013

(65) Prior Publication Data

US 2014/0111198 A1 Apr. 24, 2014

Related U.S. Application Data

(62) Division of application No. 13/193,918, filed on Jul. 29, 2011, now Pat. No. 8,760,159, which is a division of application No. 12/470,081, filed on May 21, 2009, now Pat. No. 8,054,073.

(60) Provisional application No. 61/055,010, filed on May 21, 2008.

(51) Int. Cl.
*G01V 3/00* (2006.01)
*G01R 33/24* (2006.01)
*G01R 33/032* (2006.01)
*G01R 33/26* (2006.01)
*G01R 33/32* (2006.01)

(52) U.S. Cl.
CPC .............. *G01R 33/24* (2013.01); *G01R 33/032* (2013.01); *G01R 33/26* (2013.01); *G01R 33/32* (2013.01)

(58) Field of Classification Search
CPC ........................................................ G01R 33/26
USPC .................................................. 324/301, 304
See application file for complete search history.

(56) References Cited

U.S. PATENT DOCUMENTS

| 4,070,611 | A |   | 1/1978  | Ernst          |         |
|-----------|---|---|---------|----------------|---------|
| 4,451,788 | A |   | 5/1984  | Edelstein et al.|        |
| 5,835,995 | A |   | 11/1998 | Macovski et al.|         |
| 6,097,532 | A | * | 8/2000  | Harris et al.  | 359/326 |
| 7,145,333 | B2|   | 12/2006 | Romalis et al. |         |
| 2007/0205767 | A1 | | 9/2007 | Xu et al.     |         |
| 2010/0188081 | A1 | | 7/2010 | Lammegger     |         |
| 2011/0057737 | A1 | | 3/2011 | Aoyama et al. |         |

* cited by examiner

*Primary Examiner* — Louis Arana
(74) *Attorney, Agent, or Firm* — Rankin, Hill & Clark LLP

(57) ABSTRACT

A magnetometer is provided comprising an atomic vapor in an enclosure, a source of light for preparing the vapor into a state exhibiting electromagnetically induced transparency, a first laser beam passing through the atomic vapor, a phase detector for detecting changes in phase of the first laser beam, and a controller which controls the light source and laser beam and receives the information detected by the phase detector in order to compute from those changes in phase a magnetic field strength in the presence of a selected background magnetic field of at least 0.001 T. Operation in the presence of a background field helps make this magnetometer suitable for diagnostic imaging applications.

3 Claims, 6 Drawing Sheets

METHOD AND APPARATUS FOR IMPLEMENTING EIT MAGNETOMETRY

CROSS-REFERENCE TO RELATED APPLICATIONS

This application is a divisional of U.S. application Ser. No. 13/193,918, filed Jul. 29, 2011, which in turn is a divisional of U.S. application Ser. No. 12/470,081, filed May 21, 2009, which is in turn claims priority to U.S. Provisional Application Ser. No. 61/055,010, filed May 21, 2008, all of which are incorporated by reference into this application.

TECHNICAL FIELD

This invention relates generally to magnetometry and also to the diagnostic imaging of the human body.

BACKGROUND

Magnetic resonance imaging (MRI) has come into very wide use for the imaging of the human body, for example, for the diagnosis of soft tissue abnormalities. MRI as currently practiced requires a large magnet capable of producing spatially uniform fields in excess of 1 Tesla, commonly fields of 1.5 Tesla and up to at least 3 Tesla. To generate such large uniform fields, superconducting electromagnets are normally employed. Commercially viable superconducting electromagnets are only superconducting at temperatures near 4 Kelvin and below. Superconducting electromagnets thus require a costly apparatus and are large and difficult to move.

MRI was an outgrowth of nuclear magnetic resonance (NMR), which is based on the following principles. Atomic nuclei, consisting of protons and neutrons, have intrinsic magnetic dipole moments which are commonly described as "nuclear spin." In the presence of a magnetic field, spins will align preferentially along the field direction. The energy difference between the two alignments turns out to be quite small for practical fields, much smaller than that required to move an electron to an excited state or the energy of vibrational and rotational states of atoms. Spins will also rotate around the field direction at the Larmor frequency $\omega=\gamma B$ where B is the applied magnetic field and $\gamma$ is a universal constant for each nucleus; this rotation is referred to as "precession."

An NMR analysis is carried out by placing a composition or other system to be analyzed in a high DC magnetic field and determining resonant frequencies at which electromagnetic radiation readily flips the orientation of nuclear spins. The nuclear spins whose resonant frequencies are determined may be, for example, those of the nuclei of the principal isotope of hydrogen, $^1H$. Those nuclei consist of a single proton.

Because the energy difference between the two nuclear spin orientations is small, the electromagnetic energy to flip the spin orientation lies in the radiofrequency range. In NMR, the resonant frequencies are used to determine properties of the composition or other system being analyzed, for example, its chemical composition. In general, the resonant frequency is equal to or very close to the Larmor frequency. The resonant frequency may differ slightly from the Larmor frequency because the nucleus "sees" a magnetic field slightly different from the applied field B due to the magnetic field being affected by the surrounding electron cloud. These differences due to the surrounding electrons, referred to as "chemical shifts," are used to determine the identity of chemical compounds, a principal application of NMR.

When an object is placed in a high DC magnetic field and subjected to a pulse of electromagnetic energy which changes the orientation of some of its nuclear spins, the spins will gradually return back to an equilibrium configuration. The gradual return is often referred to as "relaxation" of the spins.

In MRI, an object to be imaged, for example a portion of the human body, is placed in a large uniform DC magnetic field, often called the "measurement" field. A further spatially varying magnetic field, called a "gradient" field because its magnitude generally varies linearly with position along a particular direction in the zone of interest, is also applied to the object. Radiofrequency pulses of an appropriate shape and frequency are applied which induce $^1H$ nuclear spins in the object to align in particular directions, for example they can be rendered perpendicular to the direction of the DC magnetic field. After the radiofrequency pulse has died out, and as the spins process in the DC magnetic field, they undergo a relaxation process whereby their orientation slowly returns to collinear with the field direction, their equilibrium state. The gradient field is varied according to a predefined sequence which commonly involves the magnitude and direction of the gradient field being run through a series of discrete predetermined values which are each sustained for a period of time. The purpose of the gradient field variation sequence is to distinguish spatially (with both phase and frequency) discrete volumes of the object to be imaged. Time varying magnetic fields arising from the nuclear spin relaxation are detected. These fields are subjected to mathematical transformations, generally including a Fourier transform, which produce images of a section of the object which are used by clinicians for diagnostic purposes. The images are typically grayscale. The intensities associated with a position in the section of the object typically reflect some function of the density of $^1H$ atoms in the immediate vicinity of that position and of the time constants for the relaxation process of the nuclear spins of those atoms.

There are many references on MRI. U.S. Pat. Nos. 4,070,611 and 4,451,788 were among the early MRI patents. U.S. Pat. No. 5,835,995 describes an MRI imaging modality of particular interest.

There is a strong interest in reducing the strength of measurement fields in MRI. Reducing equipment cost is one reason. Reduced measurement field strengths are also advantageous in that the apparatus can be made more portable if no cryogenic superconducting magnets are employed. In addition, low field measurements are less sensitive to image artifacts caused by the presence of metal implants due to the metal's susceptibility.

A reason why measurement fields in excess of 1 Tesla are employed in MRI is that the magnetic signal which is detected in MRI has a signal to noise ratio proportional to the measurement field strength. See generally, e.g., T. W. Redpath, "Signal to noise ratio in MRI," *British Journal of Radiology*, 71:704-07 (1998). In order to use a lower magnetic field and yet maintain the quality of the images, it is necessary to be able to reduce the noise in the process of detection of the signal.

The normal way to detect the signal in MRI, a time-varying magnetic field, is to employ coils made of a conducting material. The coils can be made of a large number of thin conductors in parallel ("litz coils"). The time-varying magnetic field produces an electrical signal in the conducting coils as a result of Faraday's law of induction. For large fields with inductive coil detection, noise is limited by body Johnson noise. For small fields coil Johnson noise becomes significant. Johnson noise from a human body section begins to become material as compared to coil Johnson noise at measurement fields greater than a few tenths of a Tesla. Much work has gone into improving the signal to noise ratio in coil detection.

Magnetic field detectors (magnetometers) comprising superconducting quantum interference devices (SQUID) are currently regarded as the most sensitive means of measuring magnetic fields. However, SQUID-based magnetometers require very low temperatures and associated cooling equipment. Cryogenic equipment, in addition to the problems of cost, may have filling factor problems; thermal isolation requirements of sample from detector are a potential concern for signal.

It has been proposed, for example in Published U.S. Patent Application No. 20070205767 and in U.S. Pat. No. 7,145,333, to employ atomic gas magnetometers in order to detect the time varying magnetic fields which contain the signals of interest in NMR.

There are a number of difficulties with conventional atomic gas magnetometers in the MRI application. One difficulty is that some atomic gas magnetometers require an extremely low background field, whereas conventional MRI detects a small time-varying magnetic field in the presence of a large DC background magnetic field.

Thus there remains a need for magnetometers for use in MRI which introduce less noise into the measurement than conventional litz coils but which are suitable for MRI in other senses, such as for example not requiring excessive magnetic shielding, providing sufficient bandwidth, and adapting to background fields found in MRI. Such magnetometers may also have other applications, for example, to NMR.

SUMMARY OF THE INVENTION

A magnetometer is provided comprising an atomic vapor in an enclosure, a source of light for preparing the vapor into a state exhibiting electromagnetically induced transparency, a first laser beam passing through the atomic vapor, a phase detector for detecting changes in phase of the first laser beam, and a controller which controls the light source and laser beam and receives the information detected by the phase detector in order to compute from those changes in phase a magnetic field strength. The source of light is capable of producing light which places the vapor in a state exhibiting electromagnetically induced transparency in the presence of a selected background magnetic field. The phase detector is capable of extracting information from which magnetic field strength can be determined in the presence of a background field greater than about 0.001 T. Operation in the presence of a background field helps make this magnetometer suitable for diagnostic imaging applications.

DETAILED DESCRIPTION OF THE INVENTION

Definitions and Overview

It is to be understood that, unless otherwise indicated, this invention is not limited to specific arrangements of optical or electronic equipment or specific working materials. It is also to be understood that the terminology used herein is for the purpose of describing particular embodiments only, and is not intended to be limiting.

In describing and claiming the present invention, the following terminology will be used in accordance with the definitions set out below.

The singular forms "a," "an," and "the" include plural referents unless the context clearly dictates otherwise. Thus, for example, reference to "a laser beam" includes not only a single laser beam but also two or more laser beams that may or may not be combined in a single composition, reference to "a polarizing filter" includes a single polarizing filter as well as two or more polarizing filters that may or may not be combined, and the like.

Introductory Information Regarding EIT

In an aspect of the invention, a magnetometer based on electrically induced transparency is designed to meet the requirements of MRI applications.

Electromagnetically induced transparency (EIT) is a phenomenon which occurs in certain atomic vapors in which a significant proportion of the atoms have been pumped to an excited state by illuminating them, e.g., with light from a laser. Such collections can be prepared in such a way that a laser propagating through the ensemble can still exhibit low attenuation even at a resonance frequency. Such collections may also exhibit a steep index of refraction around the resonance frequency, which provides large phase shift sensitivity to detuning.

Electromagnetically induced transparency was discovered circa 1990 and has been much studied. See, e.g., K. Boller et al., "Observation of electronically induced transparency," *Phys. Rev. Lett.* 66:2593-2596 (1991); Michael Fleischhauer et al., "Electromagnetically induced transparency: Optics in coherent media," *Reviews of Modern Physics,* 77:633-673 (2005).

In a collection of atoms exhibiting EIT, the attenuation and phase shift experienced by a light beam will be a function of the difference in frequency between the light beam and the atomic resonance frequencies. This difference is often referred to as "detuning." In turn, the resonance frequency is a function of the energies of the involved atomic energy levels, which can be shifted due the presence of a magnetic field. This magnetic field induced energy level shift is referred to as the Zeeman shift. These functional relationships allow a measurement of attenuation and/or phase shift to be converted into a measurement of the magnetic field.

Figure 2:
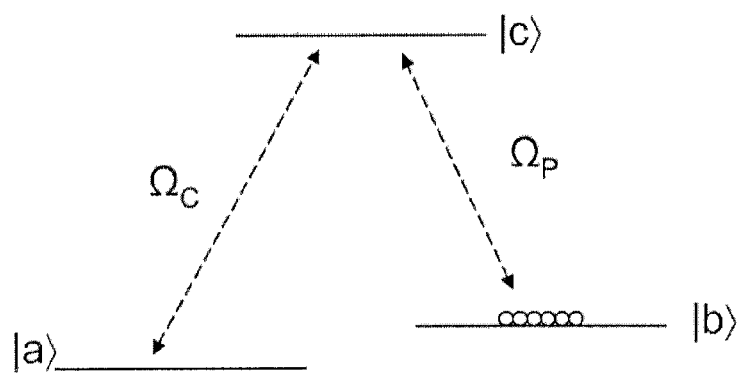
FIG. 2 (prior art) illustrates a system of three atomic energy levels (a "lambda-system") used for discussing electromagnetically induced transparency (EIT). $\Omega_p$ and $\Omega_c$ denote the Rabi frequencies for the probe and coupling beams respectively.

The physical reasons why EIT can occur in suitable atomic ensembles are commonly explained with reference to a three-level atom model (referred to as a lambda system) and with two light beams propagating through the atomic sample. As show in FIG. 2, there are three states $|a\rangle$, $|b\rangle$ and $|c\rangle$ with $|a\rangle$ and $|b\rangle$ lying lower in energy than $|c\rangle$ and transitions from $|a\rangle$ to $|c\rangle$ and $|b\rangle$ to $|c\rangle$ being possible with suitable optical excitation. As depicted in FIG. 2, only state $|b\rangle$ has significant initial occupation.

The atoms in the vapor cell are optically pumped into the appropriate occupied ground state |b⟩ with one laser beam ("pumping beam"). Optical pumping is a well established technique which uses laser light near an atomic resonance to pump all of the atoms into a desired atomic spin state. For example, σ+ polarized pumping light near resonant with the D1 or D2 lines in rubidium sends the atoms into the F=2, $m_F$=2 level (|2,2⟩).

Two further laser beams enter the vapor cell. The first beam, which we may refer to as the "coupling beam," is resonant with the transition between an unoccupied ground state |a⟩ and the excited state |c⟩. A second beam, the "probe beam," is resonant with the occupied ground state |b⟩ and the same excited state. Due to the presence of the coupling beam, a coherence effect occurs such that the ensemble of atoms enters a superposition state referred to as a "dark state." The ensemble, when it is in this quantum superposition of the unoccupied and the occupied ground state levels |a⟩ and |b⟩, is transparent to the probe beam due to destructive interference effects. (Detailed calculations are given, for example, in Fleischhauer et al., supra.) This state does not absorb nor subsequently scatter photons from the probe beam and is thus called a dark state.

The probe beam propagates through the cell, ideally without any absorption. However, due to the steep variation with frequency of the index of refraction of the atomic vapor when it has been prepared as an EIT ensemble, the probe beam acquires a steep phase shift in the presence of a non-zero detuning (i.e., where the probe frequency is not exactly at resonance). There is only zero phase shift when (i) the energy difference between the coupling and probe beams is exactly equal to the energy difference between the ground states |a⟩ and |b⟩ and (ii) the probe beam is itself resonant with the atomic transition.

When there is a magnetic field present (for example, that generated by spin precession in an object being analyzed for MRI), there will be a Zeeman shift of the atomic energy levels. This causes the probe beam to become slightly off-resonant with respect to the |b⟩→|c⟩ transition. The off-resonant characteristic will cause the probe beam to undergo a phase shift which is indicative of the magnetic field.

EIT Magnetometers of the Invention

An EIT-based magnetometer of the invention may be expected to comprise (a) an atomic vapor maintained at an adequate pressure and temperature in a suitable enclosure or "cell," (b) an inlet for pumping light into the vapor to place the atomic vapor in a state suitable for EIT, (c) a laser producing a "coupling" beam which further helps to place the atomic vapor in a suitable state for EIT, (d) a laser producing a beam ("probe beam") whose phase is measured, (e) a phase detector, and (f) a controller.

Figure 1:
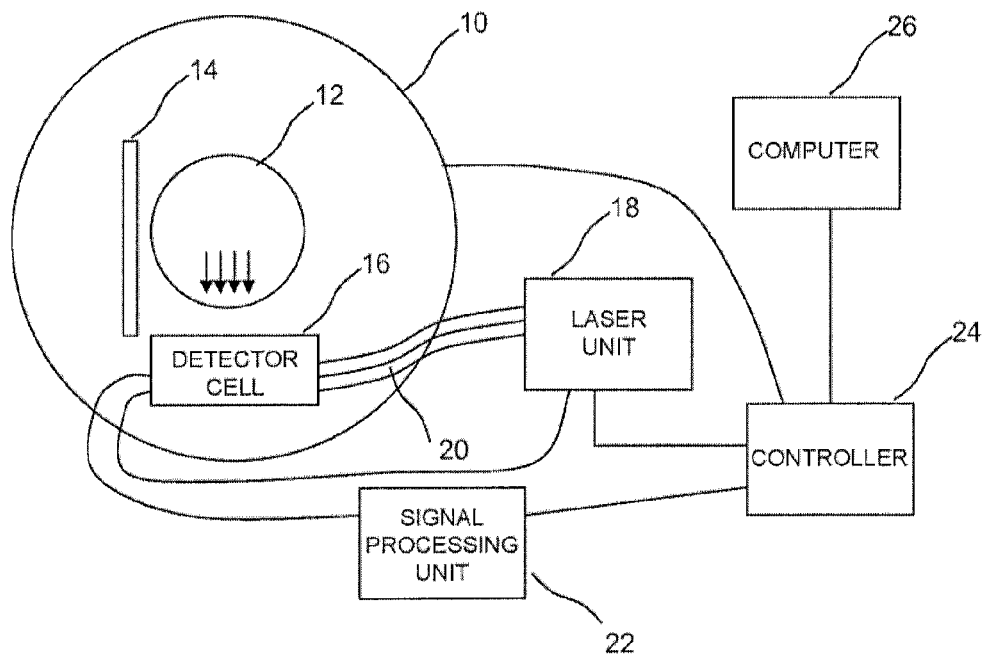
FIG. 1 schematically depicts the organization of an atomic cell magnetometer of the invention.

FIG. 1 schematically depicts a magnetometer of the invention as used in an imaging application. There is a table 14 upon which there rests an object 12 to be imaged. Table and object are surrounded by coils 10 which serve to create a magnetic field in an area encompassing the object. These can be multiple coils with independent control. There is a detector cell 16 generally comprising an atomic vapor. There is a laser unit 18 which, through optical fibers 20 (for example three), sends beams of laser-generated light into the detector cell 16. At the output of the cell information regarding the effect of passage through the cell on one of the beams' phase is communicated to a signal processing unit 22. The signal processing unit provides information to a controller 24, which communicates with and operates under the overall direction of a computer 26. The controller 24 also directs or drives the coils 10.

The atomic vapor may comprise any suitable atom which can be conveniently maintained as a vapor and which has convenient energy levels. Cesium, potassium, sodium, lithium, rubidium or other atoms may be used. The atomic vapor preferably comprises at least about $10^9$ atoms, more preferably at least about $10^{10}$ atoms, more preferably at least about $10^{11}$ atoms or at least about $10^{12}$ atoms.

The cell, fiber couples, and any other components in close proximity to the cell are preferably constructed without any metallic components. The cell enclosing the atomic vapor can made, for example, from Zerodur™ (Schott North America, Elmsford, N.Y.). An absence of metallic components serves, for example, to reduce Johnson noise.

The cell walls can be coated with a non-relaxing coating to increase the coherence time of the spin states of the atomic ensemble in the cell. In general, the gradual decoherence of the atomic vapor (e.g., due to atomic collisions with other atoms and with the walls of the cell) causes a degradation in the ability to measure magnetic fields. Coating of cell walls with suitable coatings, for example with paraffin, has been shown in other atomic vapor experiments to reduce the decoherence rate of the atoms of the vapor. Using $T_2$ to denote the decoherence half-life of the atomic vapor, $T_2$ times approaching 1 s for an atomic vapor have been achieved using appropriate coatings. It is preferred that $T_2$ be at least about 10 ms, at least about 25 ms, at least about 50 ms, at least about 75 ms, or at least about 100 ms.

The cell can be heated at low temperatures that allow for near proximity to a person without requiring extensive thermal shielding. For example, the cell could be operated at a temperature no greater than about 30° C., no greater than about 40° C., no greater than about 50° C., no greater than about 60° C., no greater than about 80° C., or no greater than about 100° C. At 30° C., densities greater than $10^{10}/cm^3$ are achieved using rubidium ($^{87}$Rb). Such temperatures can easily be generated with air convection by those skilled in the field.

Laser light is preferably brought to and from the atomic ensemble in the cell by using non-magnetic fiber couplers and ports.

The laser beams required for the practice of the invention can be generated with many different laser systems such as inexpensive frequency stabilized diode lasers or slightly more expensive lasers such as distributed Bragg reflector (DBR) and distributed feedback (DFB) lasers. A single laser can be frequency modulated to generate multiple beams (such as the probe and coupling as described below) and can be linewidth narrowed by frequency locking the laser to a high finesse cavity.

The fiber outputs of the vapor cell can be directly coupled to photodetectors. These photodetectors may be sufficiently removed from the vapor cell that the Johnson noise due to metal components in the detector housing does not contribute to the signal to noise ratio (SNR).

The Zeeman sublevels for the field regimes expected to be used in this invention will normally be well resolved but still close enough such that a single frequency pumping beam from a frequency-broadened laser could suffice to pump all levels into the desired Zeeman sublevel. Alternatively, a laser beam with frequency sidebands corresponding to the Zeeman splitting between sublevels could be used as the pumping beam.

In an alternative embodiment, the pumping beam may serve as the coupling beam as well.

In typical arrangements involving the use of atomic cells in MRI or other magnetometry applications, there will be bias/measurement fields. The coupling and probe beams are preferably tuned to be initially resonant with the Zeeman levels in the presence of the measurement field. These beams will then accumulate a small additional detuning only from any additional fields.

Setting the initial detuning for all lasers in a detector cell may be achieved by first determining a frequency scan range which is centered around the calculated atomic transition in the presence of the known bias magnetic field. For increased precision, the Breit-Rabi formula can be used to determine this range. The frequencies of the coupling and probe beam may then be scanned through a narrow frequency range around the calculated resonance. This laser frequency scan can be accomplished by modulating the laser current drivers or by using acousto-optic modulators or electro-optic modulators upstream from the optical fibers, or by using a fiber phase modulator. The frequency range may be further narrowed by independently optimizing each laser frequency for minimum transmission. At this stage of the sequence, the atoms in the ensemble equally populate all Zeeman sublevels and thus transmission measurements can be made for both the coupling and probe beams. The atoms can now be pumped out of the desired initial state into other Zeeman sublevels.

Figure 3:
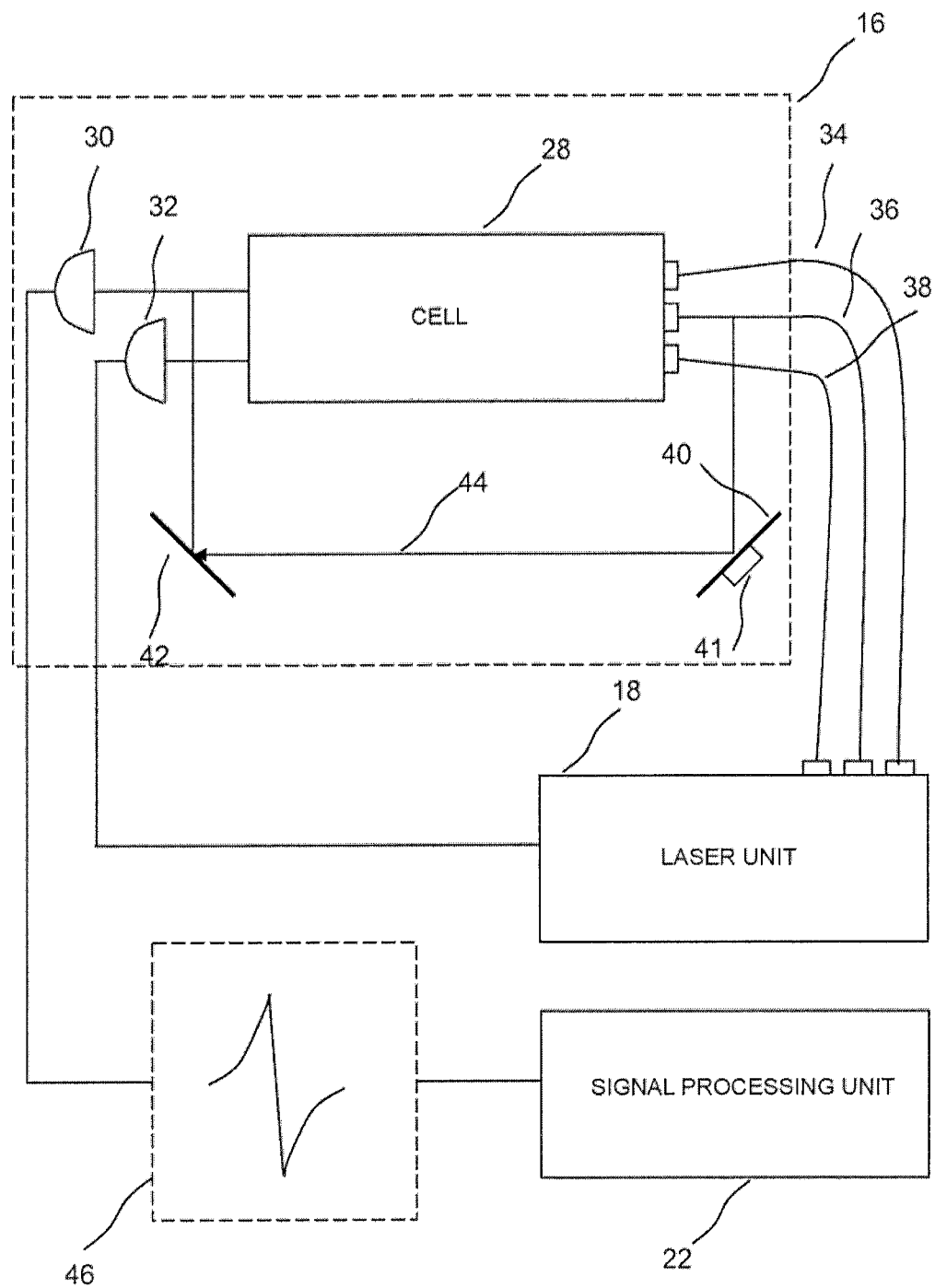
FIG. 3 depicts in further detail the control of the detection cell in a magnetometer of the invention.

FIG. 3 depicts an additional laser path 44 which is used as the reference beam path in a Mach-Zehnder interferometer set up. In that figure, we see the laser box 18, out of which three laser beams exit through fiber optics, the coupling beam 34, the probe beam 36, and the pump beam 38. These beams enter the cell 28.

The additional laser path 44 is split off from the probe beam 36. This beam does not propagate through the atomic cell and therefore does not accumulate any EIT phase contributions. Such a Mach-Zehnder set-up is a sensitive way of measuring small phase differences accumulated by laser light in two different paths. The additional path reflects from mirrors 40 and 42. The probe beam and the reference beam are overlapped in a fiber and their relative phase is detected on a photodetector 30, whose output (depicted schematically as a function of frequency in box 46) feeds into signal processing unit 22. The path length of the reference beam is adjusted using a piezoelectric device 41 placed on mirror 40 in order to zero the interferometer. In the absence of atomic occupation in the ground state level resonant with the probe beam in the atomic vapor in the cell 16, the probe beam 36 is insensitive to the atoms and therefore the phase difference between the probe and reference beams can be set to zero. A further photodetector 32 may be used to measure output for purposes of feedback control of the lasers in laser box 18.

The atoms can now be optically pumped back into their desired initial state for EIT. A scan is performed over a very narrow frequency range for the coupling and probe beams. When the probe and coupling beams are frequency adjusted so that they are resonant with their relevant atomic transitions, a zero phase condition between the probe beam and the reference is once again observed. Alternatively, the coupling beam can be locked based on the minimum transmission measurement and the probe beam frequency can then be scanned. Iterative fine tweaking of the coupling and probe beam frequencies can be accomplished with increasingly narrower range frequency scans. A clear dispersion-like signal as shown in box 46 of FIG. 3 will be seen across this zero point, which is used as a frequency reference. The laser frequencies are then fixed at this null condition. These frequencies can be stabilized, for example, by using an appropriate frequency offset lock from a saturation spectroscopy lock on an unshifted line in a magnetically shielded rubidium cell which can be located in the laser module 18. The offset lock utilizes feedback electronics which measure an error signal which is proportional to the deviation from the zero crossing. This error signal feeds back to the frequency controller for the coupling and probe beams.

In the application example of MRI, the processing magnetic spins in the imaged object (often called the "sample") generate a time dependent magnetic field which is to be measured. During the measurement stage, the frequency locks on the probe and coupling beams are momentarily turned off. The time dependent magnetic field introduces an oscillatory Zeeman shift to the atomic energy levels in the vapor cell. This small field from the sample and corresponding detuning of the probe beam from the initial atomic transition introduce a phase shift on the probe beam. The phase shift will be oscillating at the Larmor frequency of the nuclear spins from the imaged object, which will generally be at least 200 kHz. This Larmor frequency is unrelated to the Larmor frequency of the electron spins in the atomic cell, which is approximately three orders of magnitude faster.

The magnitude of the phase shift is enhanced relative to a conventional dispersive phase measurement due to the enhanced index of refraction of the EIT medium.

The phase shift which the probe beam undergoes can be measured by any technique appropriate for comparing the phase of a light beam with a reference. The measurement may be made, for example, with a Mach-Zehnder (MZ) interferometer setup using a heterodyne phase measurement as described above. Because the detection frequency at the sample Larmor frequency (>200 kHz) is sufficiently fast, noise arising from vibrations of components in the separated paths will be negligible. Similarly, magnetometers of the invention are robust against acoustic and other low frequency noise sources. An MZ heterodyne measurement also provides the possibility for using a weaker probe beam and a stronger reference beam, independently optimizing both intensities.

The phase signal due to the spin-induced magnetic field may be obtained by demodulating the phase measurement signal at the Larmor frequency of the spins in the object being imaged. The Larmor frequency is easily calculable from the known magnetic bias field at the location of the imaged sample. As noted above, there is no requirement with this technique to match the Larmor precession of the sample nuclear spins with the Larmor precession of the electron spins of the atomic ensemble. This presents a significant advantage for practical applications over other atomic vapor magnetometry techniques that are constrained by this frequency resonance matching requirement.

The cells of the invention are preferably reasonably compact so as to be, for example, of a roughly similar size to current coil detectors used in MRI. Cells may be, for example, no larger than about 10 cm in diameter, no larger than about 5 cm in diameter, no larger than about 2 cm, or no larger than about 1 cm.

Larger cells may be preferable from a noise point of view under certain circumstances. For a magnetometer of the invention with a length scale of ~5 cm at measurement field strengths ~0.005 T, with minimally heated atomic vapors, magnetic field sensitivity at the atom shot noise limit is expected to surpass the sensitivity of a litz coil at comparable detection parameters by more than a factor of 4. Expected field sensitivity for these cells lies between about 0.1 fT/$(Hz)^{1/2}$ and about 1 fT/$(Hz)^{1/2}$. For small atomic cells (~0.5 cm) with cold atoms as discussed below, sensitivity can surpass a litz coil of similar dimensions by more than an order of magnitude, with expected sensitivity of a few fT/$(Hz)^{1/2}$.

It is expected that the sensitivity of the magnetic field measurement would be atom shot noise limited for moderate field strengths at the atomic densities considered. An estimate of the sensitivity in fT/(Hz)$^{1/2}$ is $\delta B \approx 1/(\gamma\sqrt{NT_2})$ where $\gamma$ denotes the atomic gyromagnetic ratio and N is the total number of atoms interacting with the probe beam. With increased cell heating (~250° C.), the atom shot noise can become negligible compared to, for example, photon shot noise. However, such heated cells are more challenging to place in close proximity to human subjects for use as surface coil replacements in clinical imaging applications. $T_2$ times may also be adversely affected by heating.

Arrays

The EIT based magnetometers of the invention may be used in parallel or in the form of arrays. The absence of mutual induction between atomic cells in a detector array may be expected to result in both improved signal-to-noise ratio (SNR) in parallel MRI applications and a faster imaging acquisition time compared to coil arrays. Arrays of vapor cells can be arranged in the most favorable geometrical arrangement for a given imaging application without concern for mutual inductance between cells. This presents an advantage, for example, in practicing parallel magnetic resonance imaging. D. Larkam & R. Nunes, "Parallel magnetic resonance imaging," *Physics in Medicine and Biology*, 52:R15-R55 (2007).

Figure 6A:
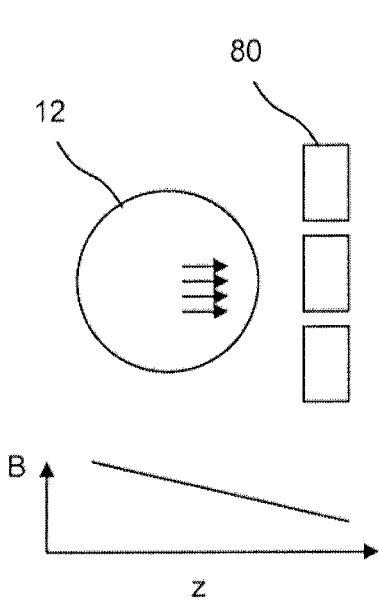
FIGS. 6A-6C schematically depict some of the ways in which magnetometers of the invention can be used in arrays.
Figure 6B:
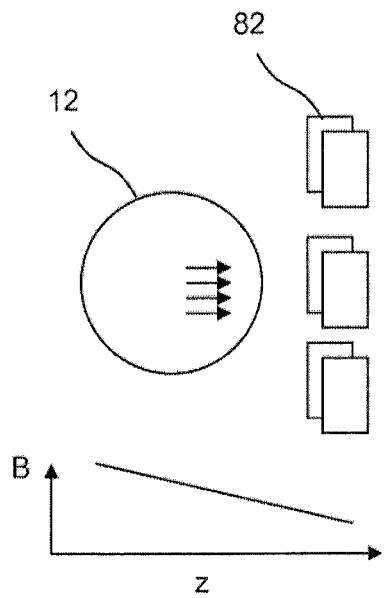
Figure 6C:
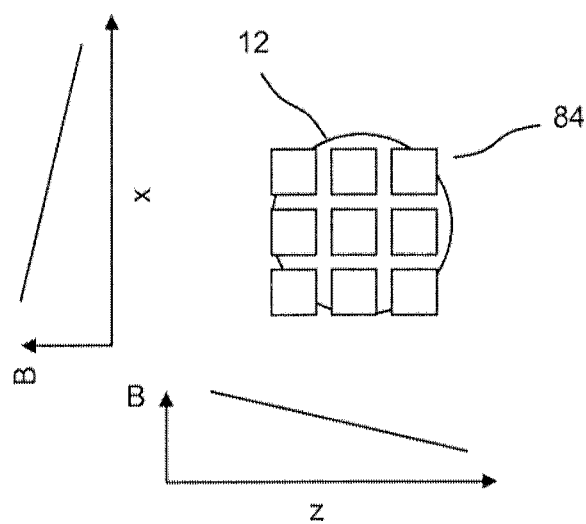

FIGS. 6A-6C depict schematically some possible configurations of arrays of detector cells. In FIG. 6A we see a one-dimensional array 80 of detector cells to detect from different positions the magnetic field of an object 12 being studied or imaged. In FIG. 6B we see a one-dimensional array 82 of detector cell pairs, each of the pairs arranged in a gradiometer configuration. In FIG. 6C we see a two dimensional array 84 of detector calls being used to detect signals from object 12. In all these cases, some of the support electronics may be shared between cells, as for example by sharing some of the control of the laser boxes (20 in FIG. 1).

Figure 5:
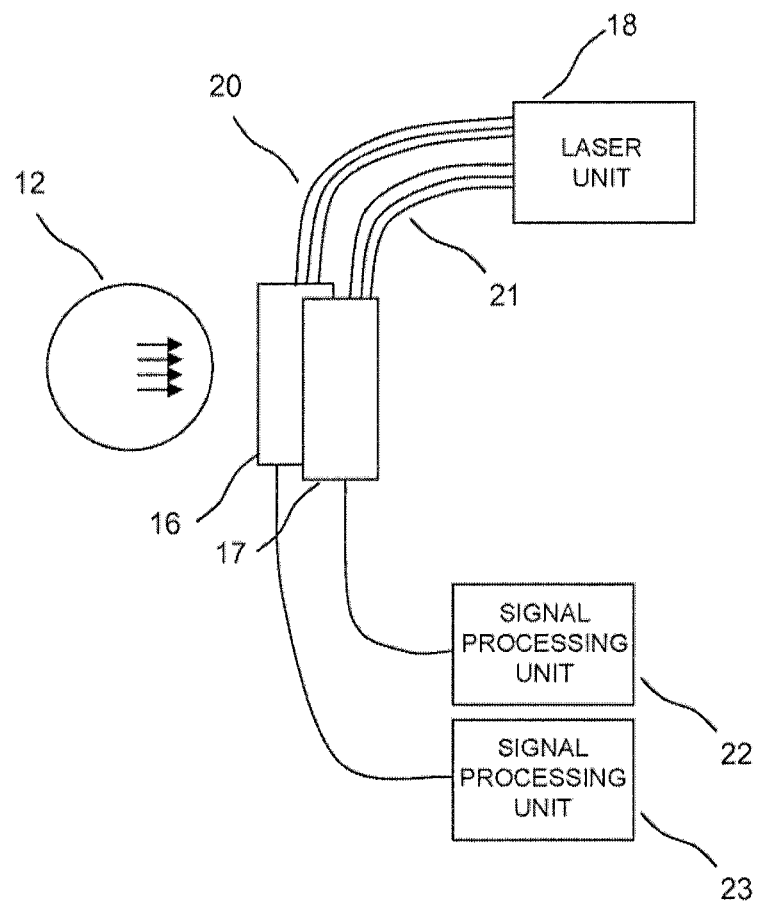
FIG. 5 schematically depicts a setup in which two detector cells are employed in a gradiometer configuration.

In the case of two cells 16 and 17 used in gradient configuration (as depicted in FIG. 5), the detuning optimization process may be done separately for each cell. Similarly, in an array of vapor cells, each cell in the array may need to be independently calibrated for laser detuning. Specifically, each cell in an array must have its laser beams frequency shifted to account for the magnetic field gradient value in its location. Therefore, the laser module in this rendition must contain sufficient frequency shifting and beam splitting optics to emit multiple probe and coupling beams at slightly different frequencies. One optical pumping beam can likely be used for all cells. The controller must have sufficient channels to process the frequency control and signal processing from each cell. A single, 1-D gradient can be arranged so that each atom in each cell has the same effective field, as shown in FIG. 6A. The demodulation frequency can be scanned to image over multiple sample slices.

MRI Systems

In a further aspect of the invention, an MRI imaging system is provided which uses EIT based magnetometers. Such a system would comprise, for example, a principal magnet producing a large magnetic field, a gradient producing electromagnet, RE coils to produce RF pulses, a table on which the patient lies, and a computer or computerized controller which governs the overall operation of the system and performs computations to obtain images. The system might also comprise, for example, RF shielding and/or magnetic shielding. The system may also comprise a second principal magnet also producing a substantially spatially homogeneous magnetic field.

In the MRI imaging system of the invention, the principal magnet produces a sufficiently spatially homogeneous field of at least about 0.1 T, at least about 0.25 T, at least about 0.5 T, or at least about 0.75 T. The principal magnet is preferably set up to operate in a pulsed manner and is preferably not a superconducting magnet. If a superconducting magnet is used, cryogenic cooling will be required which limits portability of the system. Where the principal magnet operates in a pulsed manner, a second principal magnet is preferably present which produces a substantially spatially homogeneous magnetic field of lower field strength. The field produced by the second principal magnet is preferably at least about 0.001 T, at least about 0.005 T, at least about 0.01 T, at least about 0.025 T, at least 0.05 T, at least about 0.075 T, or at least about 0.1 T. Note that where the principal magnet is superconducting and operates in a pulsed manner, a superconducting magnet would not need to exhibit as high levels of homogeneity and therefore would be significantly cheaper than the magnets in current MRI systems.

A possible sequence for a prepolarized MRI application with atomic vapor detectors is now outlined. A large (>0.5 T) magnetic field pulse is applied to the subject area, followed by a constant bias field (0.005-0.1 T) which is maintained during the measurement stage. The direction of the bias field is referred to as the z direction. A pulsed large field requires less power than a large field which is maintained, and the pulsed field is not constrained by the high homogeneity requirements of a measurement field. The pulsed field initializes a large net magnetization of the sample spins. This magnetization provides increased signal despite the lower measurement field. At this point, the laser detunings of the coupling and probe beams need to be adjusted as well as the Mach-Zehnder interferometer path length in order to create a zero-phase condition as described above. An RF pulse is subsequently applied to the sample spins which flips them, causing their precession in the x-y plane. The spin precession in the x-y plane emits a dipole radiation pattern at the sample Larmor frequency determined by the measurement field. The z-field component of that radiated field provides the time dependent Zeeman shift correction to the energy levels in atomic vapor cell. This field produces, as explained above, a time-dependent 2-photon detuning and a corresponding phase shift on the probe beam.

Any detuning of the probe beam from the resonant condition which might be generated by background field fluctuations can be distinguished from a detuning generated by the sample spin precession signal. Demodulating the phase signal at the sample spin precession frequency filters out the desired signal. For the preferred measurement field strengths, the Larmor frequency of the processing spins is greater than 200 kHz (for B>0.005 T), which is sufficiently removed from acoustic vibrations and most background field fluctuations.

At least one, but possibly multiple gradient fields may also be applied. These gradient fields enable the extraction of spatial information from the EIT phase measurements by setting up an array of small volume cells which span the field of view. The field gradients spatially distinguish the sample Larmor frequencies between small regions of the imaged sample. The demodulation frequency of the phase shift information in each cell can simply be scanned over a frequency range to sample signals from the full region and array of cells.

When a gradient field is pulsed on, then the effective background field seen by the atoms in the detector cells is transiently shifted. Since the pulse sequence is well known and controlled, its time-dependent contribution to the background Zeeman shift in each detector cell is calculable. Therefore a central controller can synchronize the gradient field pulses with frequency adjustments to the probe and coupling lasers for each cell. The controller can also commensurately adjust the demodulation frequency of the phase signal corresponding to shifts in the Larmor frequency due the field gradients. Inhomogeneous fields seen by atoms across a single cell due to the gradient pulses will lead to slight broadening of the EIT resonance.

RF and gradient pulse sequences such as echo sequences standard in MRI imaging can be applied in this setup in a straightforward manner.

Choice of Suitable Spectral Lines

EIT has been explained above in connection with an analysis in which only three atomic energy levels are taken into consideration. In general, it is difficult to find a suitable pure three-level system in atomic spectra. For example, in alkali atoms one sees a ladder of multiple hyperfine and Zeeman shifted states both in the ground and excited states of both the D1 and D2 line transitions.

Figure 4:
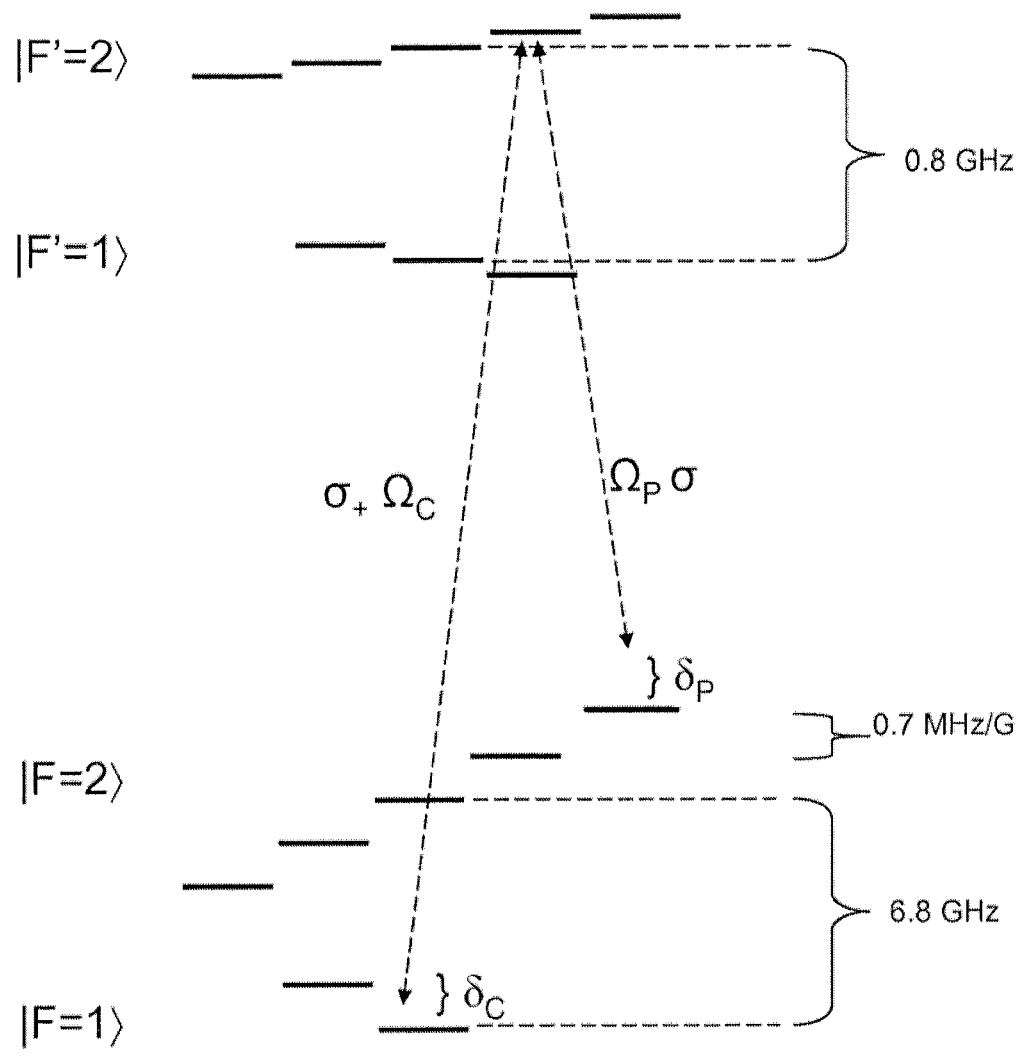
FIG. 4 depicts certain energy levels of rubidium which may be used for preparing a gas of rubidium atoms for EIT.

For the practice of the present invention, it is desired to adapt the actual spectrum of an alkali atom to achieve an EIT effect in the presence of moderate bias fields. There are several possible configurations and techniques which allow this to happen. One example of a practical lambda system and EIT sequence in Rb begins with the atoms first optically pumped into the $|2,2\rangle$ level with $\sigma+$ polarized light (levels are shown in FIG. 4). The unoccupied coupling transition is shown with $\sigma+$ polarized light resonant with the $|1,0\rangle$ to $|2',1\rangle$ transition. A second beam, the probe beam, with $\sigma-$ polarization is then incident on the atomic ensemble resonant with the $|2,2\rangle$ to $|2',1\rangle$ transition. Polarization impurities should not contribute significantly, since the Zeeman sublevels are sufficiently split such that undesired polarization components in the laser light are far from resonant from their allowed transitions. This probe beam is set up to copropagate with the coupling beam in order to achieve a Doppler-free configuration. When the sample spin processes and generates a field component in the z direction, then the $|1,0\rangle$ Zeeman sublevel is not shifted to first order, but the $|2,2\rangle$ level is shifted by $\delta = \mu_B g B_z$, where $\mu_B$ is the Bohr magneton, g is the Landé factor and $B_z$ is the z component of the signal field. This signal field introduces the detuning detected in the phase measurement. The phase shift experienced by the second probe beam for a given detuning $\delta$ scales as $\phi \propto n\delta\gamma_0/\Omega_c^2$ where n is the atomic density, $\gamma_0$ is the decay rate for the excited state and $\Omega_c$ is the Rabi frequency of the coupling laser. Absorption of the probe beam scales $\propto n\gamma_0/T_2\Omega_c^2$.

Other potential lambda systems include using a $\sigma+$ coupling beam resonant with the $|1,1\rangle$ to $|2',2\rangle$ transition and a $\pi$-polarized probe beam resonant with the $|2,2\rangle$ to $|2',2\rangle$ transition. Alternatively, one could perform several simultaneous EIT measurements utilizing multiple roughly equally spaced lambda systems as discussed, for example, in A. S. Zibrov et al., "Experimental Demonstration of Enhanced Index of Refraction via Quantum Coherence in Rb," *Physical Review Letters*, 76:3935-39 (1996). The controller for the magnetometer may control the frequency of the different light sources in order to maintain the appropriate tuning in the face of changes to magnetic fields used for measurement, e.g., bias and gradient fields in MRI. The controller may also maintain light sources tuned to the atomic resonances by a feedback loop, or alternatively the feedback may be carried out by dedicated optical or electronic/optical devices. The controller may also control the operation of the detector or detectors which are used to determine the effect of the atomic vapor on the probe beam. The controller, generally with the assistance of a signal processing unit, may be expected to record the signal detected on a photodetector and perform the necessary electronic and digital filtering and demodulation in order to extract a sensitive phase measurement. The controller desirably maintains a collection of data regarding the atomic line structure, background magnetic fields, and the effect of the background fields on the atomic lines. This information should be sufficient to allow the phase shift or other information to be converted to a measurement of magnetic field strength. The controller desirably maintains or receives sufficient information of the gradient pulses as to be able to correlate Larmor frequency demodulation with spatial location. The controller desirably has sufficient number of digital and analog channels in order to perform all of these functions. The capacities of the controller would be expected to be greater in an array configuration where a number of cells need to be serviced. The controller desirably maintains communication, whether wireless or over a standard or custom wired communication system, with other laboratory electronics. In the specific case of MRI applications, the controller would be expected to communicate with the primary computer which controls the MRI system. For example, the controller may synchronize changes in the field gradients, possibly controlled by the primary computer, with corresponding changes in the laser frequency detunings. Alternatively, some controller functions may be carried out by software on that primary computer in which case the controller forming part of the physical magnetometer may be very simple.

In using real atoms, there will generally be some number of off-resonant lines. The existence of these lines could be seen as a concern because it generates additional magnetic field noise due to the AC Stark shift. However, the relatively large Zeeman splitting from the measurement bias field reduces the significance of this effect in EIT vapors as described above.

Small Cells and Laser Cooling

The magnetometers of the invention can be made with small cells, for example, cells having diameters of less than about 1 cm, less than about 0.75 cm, less than about 0.5 cm, or less than about 0.25 cm. Smaller cells are desirable, for example, in being more easily put into position in MRI applications of near-surface imaging. A small cell could be used, for example, in an array configuration for epidermal imaging for detection of early state melanoma which originate millimeters below the skin surface. High risk populations for melanoma could have full body surface MRI screening using a large array of very small surface coils.

For smaller cells, it may be advantageous to use laser cooled atoms instead of heated vapor cells. Laser cooling is a technique whereby laser beams selectively interact with atoms in a gas in a way that substantially reduces their average velocities. For general background on laser cooling, one may consult for example Harold J. Metcalf & Peter Van der Staten, *Laser Cooling and Trapping* (1999).

The basic structure of the detector cell need not change appreciably in going to a laser-cooled implementation, since multiple beam access is already present. Alternatively, additional laser beam inlets could be provided if that is convenient for the implementation of laser cooling.

Figure 7A:
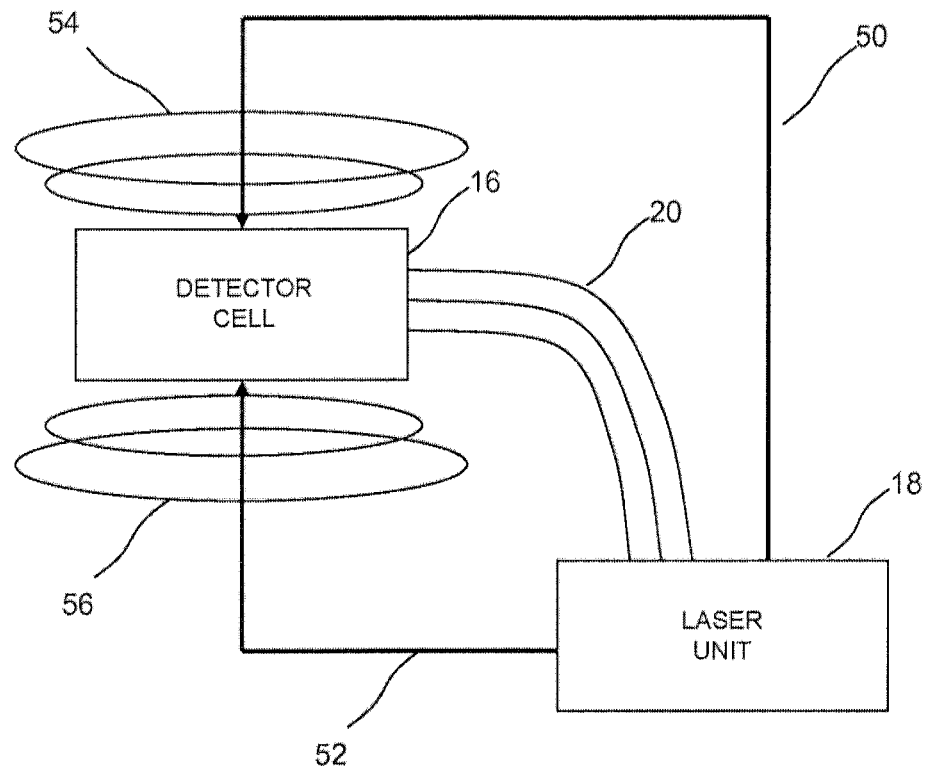
FIGS. 7A-7B schematically depict certain aspects of the embodiments of the invention in which cold atoms are used.
Figure 7B:
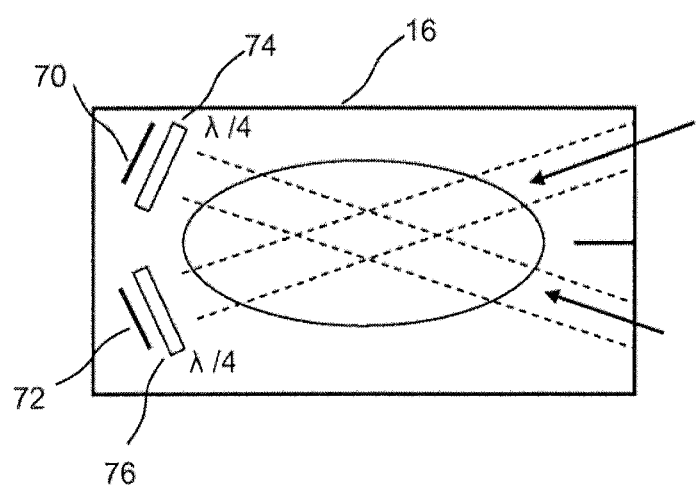

There are various techniques for achieving the laser cooling of an atomic vapor. For example, a magneto-optical trap (MOT) may be employed. A MOT is used to collect large numbers of cold and dense atoms. This is achieved by creating a scenario with polarized light and magnetic field gradients, whereby atoms preferentially absorb photons from lasers propagating in opposition to them and re-radiate photons with spherical uniformity, whereby the atoms experience momentum damping and ensuing cooling. Coils surrounding the vapor cell would be employed to implement such a trap in order to create a quadrupole magnetic field produced with suitable coils 54 and 56 (FIG. 7A). The laser module 18 in this configuration will need to contain optics and frequency shifting components such that the laser frequencies required for cooling are generated in addition to the EIT beams. Additional fiber couples 50 and 52 may be added as well for the laser cooling light. For a 3-D MOT configuration, an additional beam propagating through the atomic vapor perpendicular to the EIT beams may be used. Thus an additional fiber couple on the bottom of the cell would be employed. Furthermore, as shown in FIG. 7B, retro-reflecting mirrors 70 and 72 as well as wave plates 74 and 76 may be added within the cell 16 to complete the MOT configuration. After the loading stage, whereby cold atoms are accumulated in the MOT, the magnetic fields can be turned off and the MRI sequence can be implemented as described above for a hot atomic vapor. In this cold atom embodiment, it is less important that the probe and coupling beams co-propagate.

With laser cooling it is expected that $T_2$ times for the atomic vapor could be achieved which approach 100 ms even in small cells. The use of wall coatings such as paraffin coatings may be avoided on account of the cooling. Densities of $10^{11}/cm^3$ are expected to be achievable.

Figure 8:
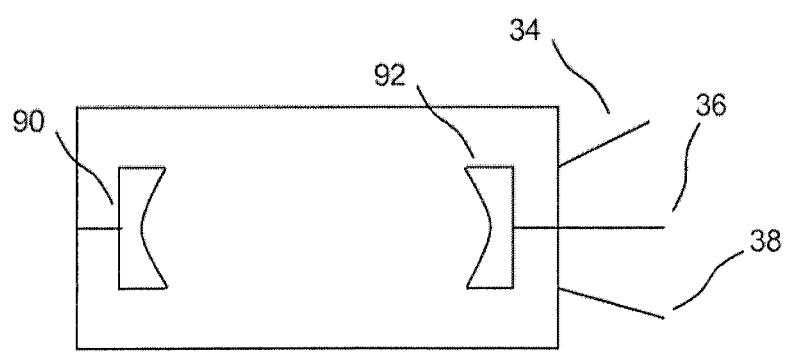
FIG. 8 schematically depicts a cell with an optical cavity enclosure.

The cell design would permit other constructional alternatives. Thus, for example, it could be possible to surround the atomic vapor with a high finesse optical cavity to enhance the effective interaction length for the probe beam and the atomic vapor. In some scenarios this can significantly improve the signal to noise ratio of the phase measurement. A large mode volume cavity can be achieved using a hemispherical cavity mode or a near planar cavity configuration with large radius of curvature mirrors. FIG. 8 schematically depicts a cell with a cavity formed along the axis of the probe beam 36, using two high finesse mirrors 90 and 92. In this configuration, the fiber couple of the probe beam may be fused to the back end of high finesse mirror 92. The finesse of this cavity may be greater than about 10, greater than about 100, greater than about 1000, greater than about $10^4$, or greater than about $10^5$.

The optical cavity can be used to improve signal when optical density is limited by experimental constraints such as collisional dephasing. The optical cavity could also be used to generate spin squeezed states with sub-Poissonian atom number fluctuations. This can achieved by using a non destructive quantum measurement of the atomic spin state in each detector cell. Such a state would improve sensitivity in atom-shot-noise limited detectors in which T2 times are less than about 10 ms. Additional techniques that could applied to the vapor cell in this invention include loading a grey optical molasses, for example from a MOT.

In a further alternative embodiment, a Bose-Einstein condensate could be used in place of the atomic vapor. There is a substantial literature on the practical achievement of Bose-Einstein condensation. Some introductory materials and references are found, for example, in Christopher J. Pethick & Henrik Smith, *Bose-Einstein Condensation in Dilute Gases* (Cambridge University Press 2002).

In the Bose-Einstein condensate embodiments of the invention, rather than a laser cooled atomic vapor, a further cooling process, for example evaporative cooling, would increase the phase space density such that the ensemble reaches the quantum degenerate space. Implementation of this approach could be achieved by loading the atoms into a MOT and then transferring them into a magnetic trap for evaporative cooling. The ensuing colder and denser quantum degenerate gas can then be pumped into and used in an EIT configuration as above. This configuration could have advantages in enabling sub-atomic shot noise limited phase measurements in an EIT MRI configuration.

Gradiometers

In a further aspect of the invention, a magnetic field gradiometer can be constructed by placing two identical magnetometer cells in close proximity, as in FIG. 5. Unlike inductive coils, atomic detectors of the invention can in general be placed arbitrarily close to each other. The differential signal detected between the two cells reflects the signal sensitivity to small changes in spatial location. The lasers, controller, and some detection optics can be shared between the magnetometer cells as will be appreciated by those of skill in the art. Some frequency shifting of laser beams between cells may be required to adjust for gradients in the background fields.

FIG. 5 schematically depicts a gradiometer configuration. There are two cells 16 and 17, physically identical, adjacent to each other and at a suitable distance from the object 12 generating the magnetic field being measured. The laser box 18 drives both cells with pump, probe, and coupling beams through fiber connections 20 and 21. The outputs of the cells may go to different signal processing units 22 and 23. It is understood that although not expressly depicted in FIG. 5, the Mach-Zehnder interferometer arrangement and photodetectors of FIG. 3 may be employed in this configuration, It is possible to arrange for two adjacent cells which have opposite phase shift dependencies on the signal magnetic field, when the Zeeman splitting in the atomic ensembles of the detector cells is in the linear region of the Zeeman shift (i.e., where the shift is approximately proportional to the magnetic field strength). For example, for rubidium cells, one can utilize the $|2,2\rangle$ and $|1,0\rangle$ ground states in one cell and the $|2,-2\rangle$ and $|1,0\rangle$ ground state levels can be utilized in the other cell. In an arrangement of this type, the difference of the phase shifts through the two cells gives twice the signal from an equidistant point, but with common mode noise rejected.

A setup with opposing phase shifts provides a gradiometry configuration which does not require the cells to be equidistant on opposite sides of the imaged sample as in other atomic magnetometry approaches. It is often difficult or impossible to place gradiometer cells equidistant on opposite sides of the sample, e.g., in near surface imaging applications.

Spectroscopy Applications

The magnetometers of the invention may be applied to spectroscopy as well as MRI imaging. In spectroscopy applications such as NMR, the spin precession frequencies in low measurement fields are centered around a low frequency at which inductive coil detection is often limited by the coil's own Johnson noise. Atomic magnetometers of the invention may reduce noise for NMR measurements in a moderate bias field (B>0.005 T). Spectroscopy at these moderate field strengths benefits from increased bandwidth and reduced sensitivity to transverse field gradients as compared to NMR studies with atomic magnetometers at extremely low measurement fields. In addition, the magnetometers of the invention are generally not constrained by any need to match the nuclear spin precession frequencies with the electron Larmor frequencies in the atomic cell. The entire frequency spectrum observed from a sample can be detected by sweeping the detection demodulation frequency.

Detector cells of the invention can therefore be used for a NMR gyroscope in order to sensitively measure rotations as required in navigation applications (for background on NMR gyroscopes see U.S. Pat. No. 7,239,135). A slight precession frequency shift in the NMR sample due to a platform rotation, shifts a radio frequency pulse to be slightly off-resonant as compared to a pulse in a non-rotating frame. The pulse is therefore slightly less efficient and correspondingly a spin oriented in the z direction is not as efficiently flipped to precess in the x-y plane under the presence of a $\pi/2$ RF pulse.

The amplitude of the precessing spin is therefore reduced and the ensuing magnetic field from the precession of the magnetic dipole is reduced as well. As above, this changes the effective Zeeman shift seen by a detector cell of the kind described in this application. The RF pulse frequency can be dithered in order to determine the exact resonance and thereby extract the correction due to the rotating platform.

In nuclear quadrupole resonance (NQR) applications, the frequency of the emitted field is independent of the background magnetic field, and is rather due to the internal atomic structure in the sample. Using a moderate bias field in the atomic detector cell in the configuration of this invention can be advantageous however, in reducing sensitivity to background field fluctuations.

The magnetometers of the invention may be used for many of the applications for which optical magnetometers have been used, as listed for example in the patents cited in the background section. Other applications include natural resource detection, atomic frequency standards, atom interferometry gyroscopes, and gravimetry for navigation and natural resource detection.

It is to be understood that while the invention has been described in conjunction with preferred specific embodiments thereof, the foregoing description is intended to illustrate and not limit the scope of the invention. Other aspects, advantages, and modifications within the scope of the invention will be apparent to those skilled in the art to which the invention pertains.

All patents, patent applications, and publications mentioned herein are hereby incorporated by reference in their entireties. However, where a patent, patent application, or publication containing express definitions is incorporated by reference, those express definitions should be understood to apply to the incorporated patent, patent application, or publication in which they are found, and not to the remainder of the text of this application, in particular the claims of this application.

REFERENCES

I. Savukov, S. Seltzer, M. Romalis, "Detection of NMR Signals with a radio-frequency atomic magnetometer," *Journal of Mag. Res.* 185, 214-220 (2007).
S. Xu et al., "Magnetic Resonance Imaging with an optical atomic magnetometer," *PNAS* 103, 12668-12671 (2006).
R. Venook et al., "Prepolarized magnetic resonance imaging around metal orthopedic implants," *Mag. Res. Img.* 56, 177-186 (2006).
A. Macovski, "Noise in MRI," *Mag. Res. Med.* 36, 494-497 (1996).
I. Savukov et al., "Tunable atomic magnetometer for detection of radio-frequency magnetic fields," *Phys. Rev. Lett.* 95, 63004-63007 (2005).
K. Boller, A. Imamoglu, S. Harris, "Observation of electronically induced transparency," *Phys. Rev. Lett.* 66, 2593-2596 (1991).
A. Zibrov et al., "Experimental demonstration of enhanced index of refraction via quantum coherence in Rb," *Phys. Rev. Lett.* 76, 3935-3938 (1996).
A. Macovski & S. Conolly, "Novel approaches to low-cost MRI," *Mag. Res. Med.* 30, 221-230 (1993).
W. Shao et al., "Low readout field magnetic resonance imaging of hyperpolarized xenon and water in a single system," *App. Phys. Lett.* 80, 2032-2034 (2002).
V. Acosta et al., "Nonlinear magneto-optical rotation with frequency-modulated light in the geophysical field range," *Phys. Rev. A* 73, 053404-053411 (2006).
D. Larkman & R. Nunes, "Parallel magnetic resonance imaging," *Phys. Med. Biol.* 52, R15-R55 (2007).
T. W. Redpath, "Signal to noise ratio in MRI," *British J. Radiology*, 71, 704-07 (1998).
M. Fleischhauer et al., "Electromagnetically induced transparency: Optics in coherent media," *Rev. Mod. Phys.*, 77, 633-673 (2005).
M. Fleischhauer, A. Matsko, M. Scully, "Quantum Limit of Optical Magnetometry in the Presence of ac Stark Shifts," *Phys. Rev. A* 62, 013808-1:013808-10 (2000).
A. Nagel et al., "Experimental realization of coherent dark state magnetometers," *Europhysics Letters*, 44, 31-36 (1998).
D. Budker et al., "Resonant non-linear magneto-optical effects in atoms," *Rev. Mod. Phys.* 74, 1153-1201 (2002).
Harold J. Metcalf & Peter Van der Straten, *Laser Cooling and Trapping* (Springer 1999).
Christopher J. Pethick & Henrik Smith, *Bose-Einstein Condensation in Dilute Gases* (Cambridge University Press 2002).
R. Ernst, "Gyromagnetic resonance Fourier transform zeugmatography," U.S. Pat. No. 4,070,611 (1978).
W. Edelstein et al., "Methods of producing image information from objects," U.S. Pat. No. 4,451,788 (1984).
A. Macovski & S. Connolly, "Localized pulsed superconductive MRI system," U.S. Pat. No. 5,835,995 (1998).
M. Romalis et al., "High sensitivity atomic magnetometer and methods for using same," U.S. Pat. No. 7,038,450 (2006).
M. Romalis et al., "High sensitivity atomic magnetometer and methods for using same," U.S. Pat. No. 7,145,333 (2006).
J. Clarke et al., "NMR and MRI apparatus and method," U.S. Pat. No. 7,187,169 (2007).
H. Abbink et al., "NMR Gyroscope," U.S. Pat. No. 7,239,135 (2007)
S. Xu et al, "Atomic magnetic gradiometer for room temperature high sensitivity magnetic field detection," US Published Patent Application No. 20070205767
M. Scully and M. Fleischhauer, "High sensitivity magnetometer based on index enhanced media," *Phys. Rev. Lett.* 69:1360-1363 (1992).

What is claimed:

1. A method of diagnostic imaging comprising (a) exposing a subject to a pulsed magnetic field of at least about 0.25 T, (b) exposing a subject to a magnetic field of at least about 0.001 T which is substantially spatially homogeneous in a region of interest of the subject, (c) exposing the subject to a radiofrequency pulse which causes nuclei of atoms within the subject to experience spin precession, (d) subjecting the subject to an additional magnetic field, (e) providing a cell containing an atomic vapor, (f) preparing the atomic vapor in a state that exhibits electromagnetically induced transparency, (g) traversing the atomic vapor with a laser beam, (h) detecting a characteristic of the laser beam, (i) using as an input the detected characteristic and the characteristics of the additional magnetic field, estimating a function of the spin precession caused by the radiofrequency pulse, and (j) using the estimated function of the spin precession to produce an image of the region of interest.

2. The method of claim 1, further comprising the step of cooling the vapor by means of laser cooling.

3. The method of claim 1, further comprising the step of cooling the vapor with evaporative cooling so as to produce a Bose-Einstein condensate.

* * * * *